(12) United States Patent
Tsuchiya et al.

(10) Patent No.: US 8,124,432 B2
(45) Date of Patent: Feb. 28, 2012

(54) NITRIDE SEMICONDUCTOR OPTICAL ELEMENT AND MANUFACTURING METHOD THEREOF

(75) Inventors: Tomonobu Tsuchiya, Hachioji (JP); Shigehisa Tanaka, Koganei (JP); Akihisa Terano, Hachioji (JP); Kouji Nakahara, Kunitachi (JP)

(73) Assignee: Opnext Japan, Inc., Kanagawa (JP)

( * ) Notice: Subject to any disclaimer, the term of this patent is extended or adjusted under 35 U.S.C. 154(b) by 43 days.

(21) Appl. No.: 12/630,008

(22) Filed: Dec. 3, 2009

(65) Prior Publication Data

US 2010/0150194 A1 Jun. 17, 2010

(30) Foreign Application Priority Data

Dec. 15, 2008 (JP) ................................. 2008-318274

(51) Int. Cl.
*H01L 21/205* (2006.01)
*H01L 31/18* (2006.01)
*H01S 5/22* (2006.01)
*H01S 5/343* (2006.01)

(52) U.S. Cl. .................... 438/46; 438/47; 257/E21.365; 257/E21.366; 257/E21.367; 257/E33.028; 257/E21.108; 257/94; 257/14; 257/E31.033; 372/45.01

(58) Field of Classification Search .................... 438/46, 438/47; 257/14, 94, E33.028, E21.365, E21.366, 257/E21.367, E21.108, E31.033; 372/45.01
See application file for complete search history.

(56) References Cited

U.S. PATENT DOCUMENTS

| | | | | |
|---|---|---|---|---|
| 5,693,963 A | * | 12/1997 | Fujimoto et al. | 257/94 |
| 5,966,396 A | | 10/1999 | Okazaki et al. | |
| 6,015,979 A | * | 1/2000 | Sugiura et al. | 257/86 |
| 6,365,923 B1 | * | 4/2002 | Kamei | 257/103 |
| 6,493,367 B1 | * | 12/2002 | Ito et al. | 372/45.01 |
| 6,806,507 B2 | * | 10/2004 | Ishida | 257/101 |
| 6,998,284 B2 | * | 2/2006 | Kyono et al. | 438/46 |
| 7,456,034 B2 | * | 11/2008 | Ikedo et al. | 438/22 |

(Continued)

FOREIGN PATENT DOCUMENTS

JP 10-93198 A 4/1998

(Continued)

OTHER PUBLICATIONS

Fumio Hasegawa et al., "Wide-Gap Semiconductors Optical/Electronic Devices", pp. 360-367, Morikita Publishing Co., Ltd., Mar. 2006.

(Continued)

*Primary Examiner* — Mary Wilczewski
(74) *Attorney, Agent, or Firm* — Mattingly & Malur, PC

(57) ABSTRACT

In an InGaN-based nitride semiconductor optical device having a long wavelength (440 nm or more) equal to or more than that of blue, the increase of a wavelength is realized while suppressing In (Indium) segregation and deterioration of crystallinity. In the manufacture of an InGaN-based nitride semiconductor optical device having an InGaN-based quantum well active layer including an InGaN well layer and an InGaN barrier layer, a step of growing the InGaN barrier layer includes: a first step of adding hydrogen at 1% or more to a gas atmosphere composed of nitrogen and ammonia and growing a GaN layer in the gas atmosphere; and a second step of growing the InGaN barrier layer in a gas atmosphere composed of nitrogen and ammonia.

9 Claims, 17 Drawing Sheets

U.S. PATENT DOCUMENTS

| | | | |
|---|---|---|---|
| 7,488,971 B2 * | 2/2009 | Kobayakawa et al. | 257/13 |
| 7,714,350 B2 * | 5/2010 | Sugawara et al. | 257/102 |
| 2005/0199903 A1 * | 9/2005 | Kyono et al. | 257/103 |
| 2005/0226295 A1 * | 10/2005 | Taneya et al. | 372/45.01 |
| 2006/0098703 A1 * | 5/2006 | Kuramoto | 372/43.01 |
| 2006/0220044 A1 * | 10/2006 | Sugawara et al. | 257/96 |
| 2010/0142577 A1 * | 6/2010 | Tsuda et al. | 372/45.01 |
| 2010/0150194 A1 * | 6/2010 | Tsuchiya et al. | 372/45.01 |

FOREIGN PATENT DOCUMENTS

| | | | |
|---|---|---|---|
| JP | 2002-43618 | * | 2/2002 |

OTHER PUBLICATIONS

Kiyoshi Takahashi, Akihiko Yoshikawa & Adarsh Sandhu (Eds.),"Wide Bandgap Semiconductors", Springer pp. 393-400, ISBN 978-3-540-47234-6 pp. 360-367, 2007.

Akinori Ubukata et al., "PL characterization of In surface segregation in InGaN/GaN Multiple Quantum Well Structures using MOCVD reactor (2" x6 wafers)", IEICE (Institute of Electronics, Information and Communication Engineers, Technical Report ED2005-156, CPM2005-143, LQE005-83 (Oct. 2005), pp. 81-84 (2005).

* cited by examiner

FLUORESCENT MICROSCOPE IMAGE OF DEVICE STRUCTURE IN THE CASE WHERE
HYDROGEN IS ADDED AFTER BARRIER LAYER IS GROWN TO 1 nm

FIG. 4
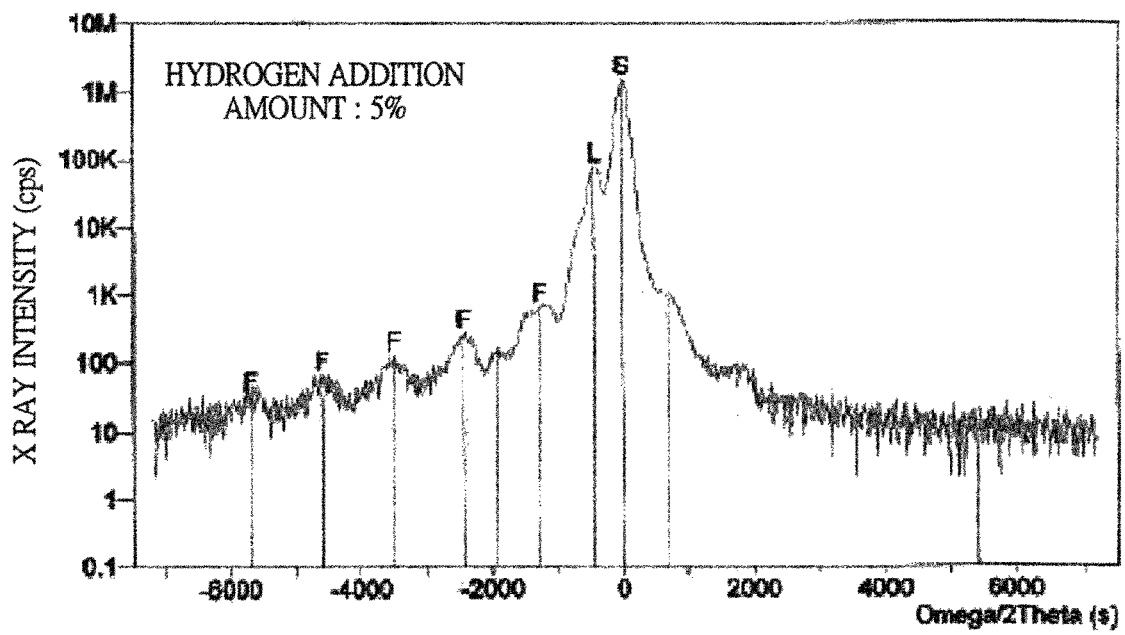
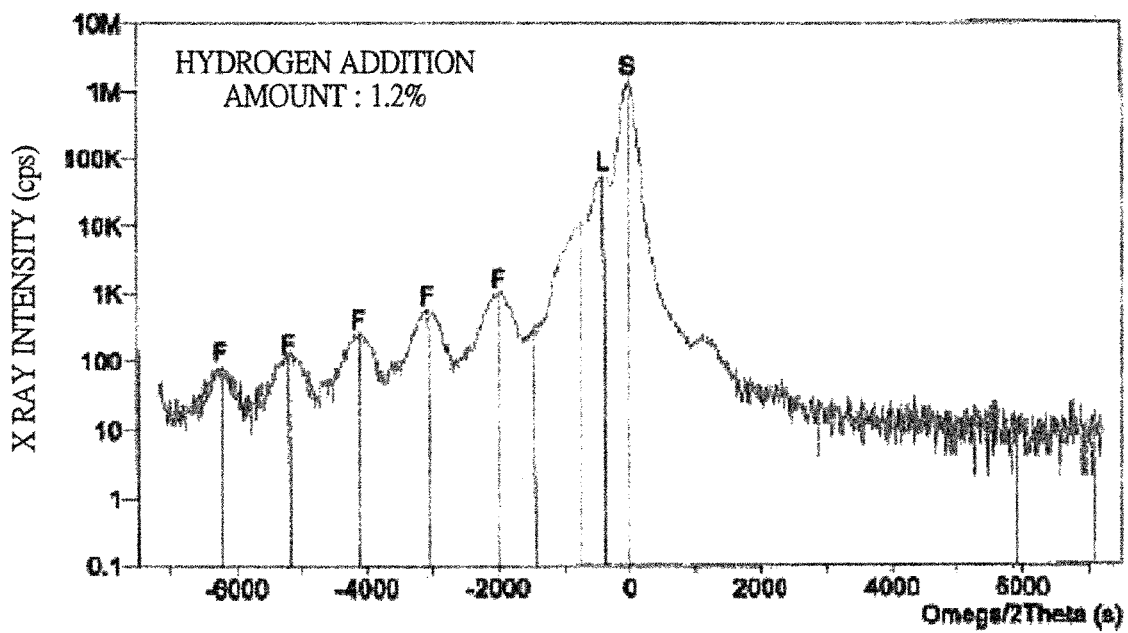

FIG. 5
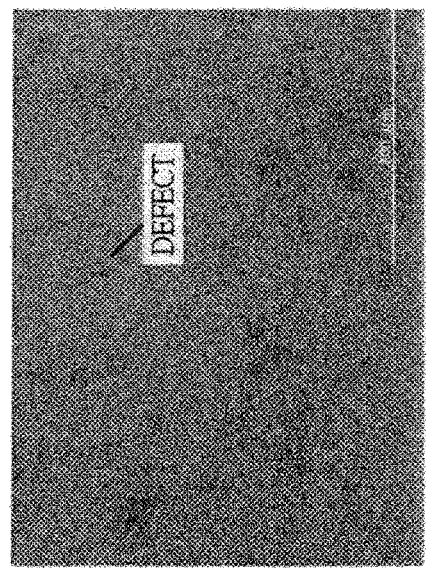
HYDROGEN ADDITION AMOUNT: 0.5%
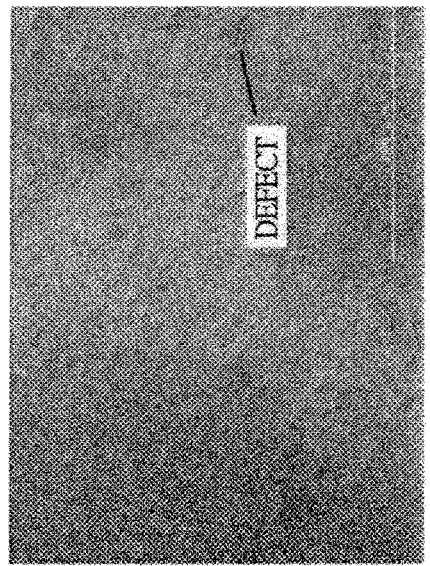
HYDROGEN ADDITION AMOUNT: 1.2%
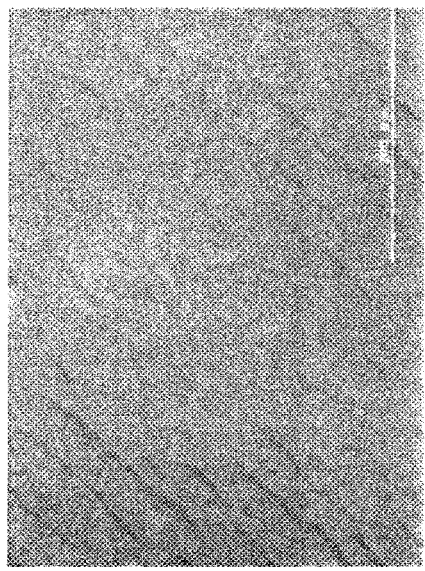
HYDROGEN ADDITION AMOUNT: 5%

FILM THICKNESS OF BARRIER LAYER WITH NO HYDROGEN ADDITION (nm)

FIG. 8
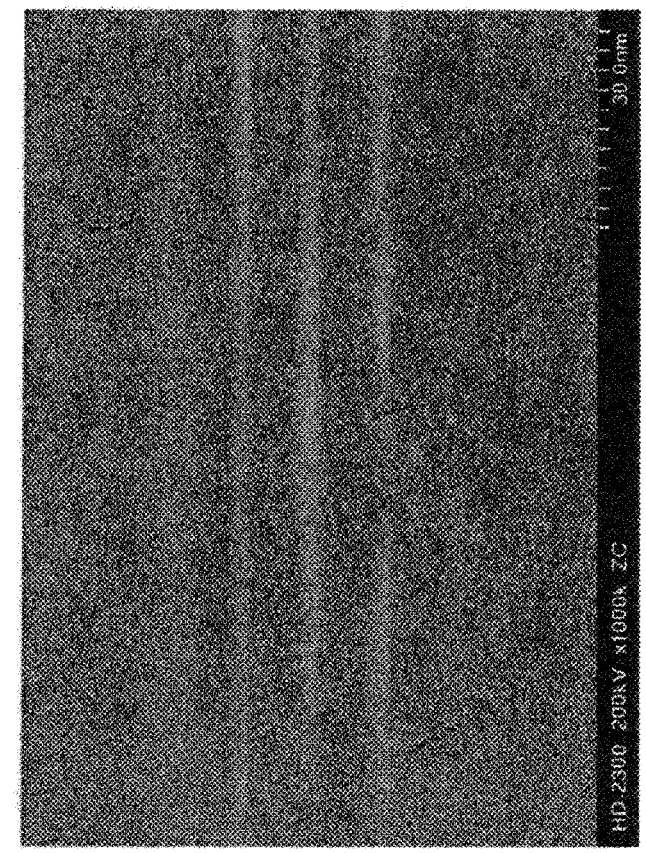
MQW IN THE CASE WHERE HYDROGEN IS ADDED
DURING GROWTH OF BARRIER LAYER
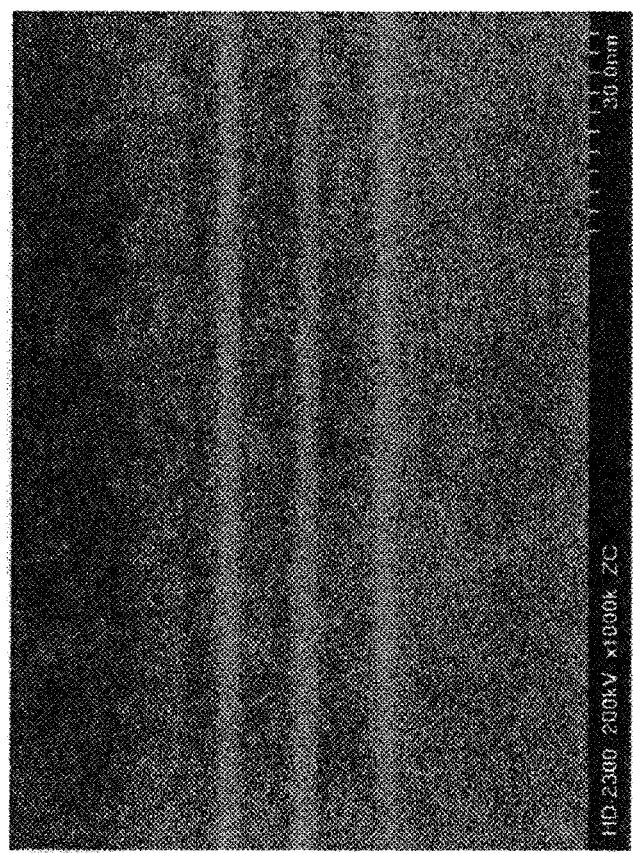
MQW IN THE CASE WHERE HYDROGEN IS ADDED AFTER
BARRIER LAYER IS GROWN TO 2 nm

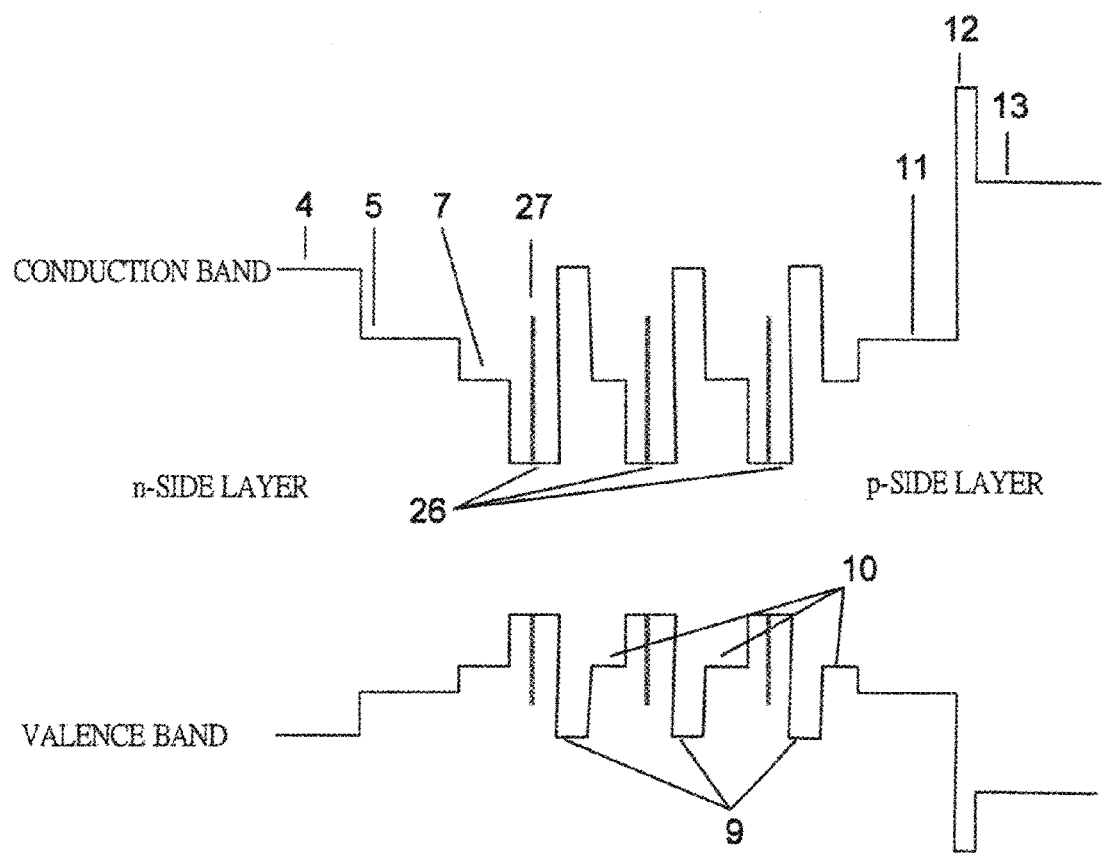

NITRIDE SEMICONDUCTOR OPTICAL ELEMENT AND MANUFACTURING METHOD THEREOF

CROSS-REFERENCE TO RELATED APPLICATION

The present application claims priority from Japanese Patent Application No. JP 2008-318274 filed on Dec. 15, 2008, the content of which is hereby incorporated by reference into this application.

TECHNICAL FIELD OF THE INVENTION

The present invention relates to a nitride semiconductor optical device and a manufacturing technique thereof, and more particularly to a technique effectively applied to an InGaN-based nitride semiconductor optical device having a long wavelength equal to or more than that of blue (440 nm or more) and a manufacture method thereof.

BACKGROUND OF THE INVENTION

Conventionally, with respect to the practical wavelength regions of nitride semiconductor optical devices, the wavelength region in a practical level is about 365 nm to 550 nm in a light emitting diode and is 375 nm to 488 nm in a laser diode. In both the light emitting diode and the laser diode, device characteristics are deteriorated as the wavelengths are increased from those of a blue-violet region to a near-blue region, and further to a near-green region. Therefore, the lasing wavelength of the laser diode is limited to 488 nm at a maximum, and the green region is an unexplored wavelength region of the laser diodes.

The following factors are regarded as the reasons therefor from the viewpoints of the device structure and crystallinity. First, from the viewpoint of the devices structure, since piezoelectric polarization is increased along with the increase of the In (Indium) composition ratio, spatial separation occurs between electrons and holes, so that light emitting efficiency is lowered. Also, from the viewpoint of the crystallinity, it has been reported that spatial non-uniformity of an InGaN composition occurs along with the increase of the In composition ratio, and as a result, regions having a high In composition ratio and regions having a low In composition ratio are separately formed in a plane, and furthermore, segregation of In and defects are caused.

The reason why the realizable wavelength regions on the long-wavelength side are different between the light emitting diodes and the laser diodes is that the laser diodes have high threshold carrier densities for lasing compared with the light emitting diodes, and therefore, the wavelengths thereof are readily reduced due to band filling or reduction of internal electric fields. Moreover, compositional fluctuation of an InGaN light emitting layer is increased along with the increase of the wavelength, and defects are caused. Furthermore, light emitting efficiency is lowered because the internal electric fields caused by piezoelectric polarization are increased, and the wavelength difference between the light emitting diodes and the laser diodes is also increased. Therefore, along with the increase of the wavelength, the threshold current value is readily increased, and the light emitting efficiency is readily lowered.

With respect to the above-described problems, from the viewpoint of the device structure, it has been reported that the width of the Well layer is reduced to about 3 nm in order to increase the spatial overlapping of electrons and holes (for example, "Wide-Gap Semiconductors Optical/Electronic Devices", Morikita Publishing Co., Ltd., pp. 360 to 367 (Non-Patent Document 1) and "Wide Bandgap Semiconductors" Kiyoshi Takahashi, Akihiko Yoshikawa and Adarsh Sandhu (Eds.) Springer pp. 393 to 400, ISBN 978-3-540-47234-6 pp. 360 to 367 (Non-Patent Document 2)).

Metal-organic chemical vapor deposition is mainly used as a crystal growth method of nitride semiconductors, and in order to suppress the segregation of In from the viewpoint of crystallinity, a method of improving the crystallinity by adding hydrogen during the interruption of growth of a well layer and a barrier layer (Japanese Patent Application Laid-Open Publication No. 10-93198 (Patent Document 1)) and a method of improving the abruptness in the interface by adding hydrogen to a GaN barrier layer in an InGaN/GaN quantum well structure (IEICE (Institute of Electronics, Information and Communication Engineers) Technical Report ED2005-156, CPM2005-143, LQE005-83 (2005-10), pp. 81 to 84 (2005) (Non-Patent Document 3)) have been reported.

Furthermore, with respect to the general growth conditions of an InGaN layer, since the reactions thereof are somewhat different from those of a GaN layer and an AlGaN layer, the following facts have been known. That is, the AlGaN layer and the GaN layer use hydrogen as a carrier gas in the crystal growth and are grown at a high temperature of 1000 to 1100° C., whereas the InGaN layer uses nitrogen as a carrier gas in order to take in the In composition and has to be grown at a low temperature of around 800° C. Also, for the further increase of the wavelength, in addition to changing the gas-phase ratio of an In source material and a Ga source material, the growth temperature of the well layer has to be further lowered (for example, Non-Patent Documents 1 and 2).

SUMMARY OF THE INVENTION

In the conventional technique described in Patent Document 1, a method in which hydrogen is added to the interface between the well layer and the barrier layer at a rate of 0.01 to 1% is described, and it is reported that the segregation of In can be eliminated by the addition of hydrogen and the crystallinity is improved. However, there is a problem that, when the growth interruption time after the well layer growth is long, the InN composition is desorbed from the surface of the InGaN well layer and the lasing wavelength of laser is reduced. Moreover, there is also a problem that, since the effect of etching is increased when hydrogen is added, the desorption of the InN composition from the surface becomes pronounced.

For example, when hydrogen is added by about 1% to the entire barrier layer instead of the interface between the well layer and the barrier layer like in above-described Non-Patent Document 3, the composition variation regions in both interfaces of the well layer are reduced, and the abruptness of the interfaces is improved. However, when hydrogen is added to the entire barrier layer, hydrogen of the barrier layer is mixed in the growth of the well layer, so that the wavelength of the well layer is reduced. Furthermore, since the In composition ratio of the barrier layer is significantly reduced when hydrogen is added to the entire barrier layer, the layer becomes a GaN barrier layer. Therefore, in a laser diode, the refractive index difference between an active layer and a cladding layer is reduced, and the light confinement coefficient with respect to the active layer is reduced, and as a result, the threshold current value and slope efficiency of laser are drastically increased. Particularly, in a laser diode having a long lasing wavelength, along with the increase of the wavelength, the refractive index difference between the active layer and the cladding layer is reduced, and the light confinement coefficient is also reduced.

As described above, the film-thickness increase of the InGaN layer and the increase of the In composition ratio in the barrier layer and the guide layer are important problems for the laser diode having a long lasing wavelength. Table 1 and FIG. 1 show the contents of the above-described study.

TABLE 1

| INTERFACE PURGE CONDITION | WAVELENGTH (nm) OF LIGHT EMITTED BY STIMULATION (EXCITATION LIGHT SOURCE: 355 nm, PULSE) |
|---|---|
| NITROGEN PURGE 0 sec | 428 |
| NITROGEN PURGE 5 sec | 428 |
| NITROGEN PURGE 60 sec | 419 |
| NITROGEN PURGE 60 sec + ADD HYDROGEN TO INTERFACE AFTER BARRIER LAYER GROWTH | 415 |
| ADD HYDROGEN TO BARRIER LAYER AND INTERFACES ON AND BELOW BARRIER LAYER | 409 |

Table 1 shows the wavelengths (approximately corresponding to the oscillation wavelengths of laser) of the light emitted by stimulation in a high power excited state with respect to the purge time of the interface between a well layer and a barrier layer, and it represents the interruption time dependency in the cases of using only nitrogen and the cases of adding hydrogen. Also, FIG. 1 shows the profiles of the In composition ratio by the secondary ion mass spectrometer (SIMS) analysis in the case where only a nitrogen gas is used for the purge of the interface, the case where hydrogen is added to the purge after barrier layer growth, and the case where hydrogen is added during barrier layer growth.

It can be understood that, when hydrogen is added during the growth of the barrier layer, the In composition is reduced to the vicinity of the background level and the wavelength thereof is reduced most. Therefore, the above-described conventional techniques are not suitable for realizing the laser wavelength equal to or more than that of pure blue (440 nm or more), particularly, the laser wavelength of blue to green (530 nm) which is an object of the present invention.

In view of the above-described study results, the present invention provides a manufacturing method of an InGaN-based semiconductor optical device capable of achieving the increase of wavelengths while suppressing the In segregation and the deterioration of crystallinity so as to realize the improvement of laser characteristics and light emitting diode characteristics in the region from blue (440 nm) to green (530 nm), the increase of the lasing wavelength, the improvement of efficiency of a green light emitting diode, and the practical use of a light emitting diode in the vicinity of 600 nm.

The above and other objects and novel characteristics of the present invention will be apparent from the description of this specification and the accompanying drawings.

In order to achieve the above-described objects, in the present invention, the following processes are carried out in the manufacture of a nitride semiconductor optical device having an n-type cladding layer, an InGaN-based quantum well active layer, a guide layer, a p-type cladding layer, and a p-type contact layer on a semiconductor substrate.

More specifically, when a barrier layer is to be grown after a well layer of an InGaN-based quantum well active layer is grown, hydrogen is added to a gas atmosphere composed of nitrogen and ammonia only in an initial film growth and a film is grown in the gas atmosphere, and then, after the hydrogen addition is stopped, a film is formed in a gas atmosphere composed of nitrogen and ammonia. In this process, the hydrogen addition concentration in the initial film growth is 1% or higher of the gas atmosphere, and the grown film thickness thereof is several nm. Also, the thickness of the film grown thereafter in the gas atmosphere composed of nitrogen and ammonia is several nm or more. Through the above-described processes, the increase of the wavelength of the lasing wavelength can be realized while suppressing the deterioration of crystallinity.

Next, the above-described processes will be described in detail. First of all, in an InGaN-based crystal layer, the crystallinity is readily deteriorated along with the increase of the wavelength (increase of In composition ratio). This is because the optimal growth temperatures of InN and GaN are significantly different, and if growth interruption time becomes long, the InN component is readily desorbed. Therefore, the growth interruption time at the interface between the well layer and the barrier layer is set to be somewhat short (between about several seconds to 10 seconds, and 5 seconds in the present study according to Table 1). Furthermore, instead of changing the growth temperatures of the well layer and the barrier layer in the growth interruption like above-described Patent Document 1, the growth temperature is changed at the points of the initial several nm and the last several nm in the growth of the barrier layer. Also, with respect to the growth temperature, the growth rate and group 3 element ratio are optimized, thereby reducing the difference in growth temperature.

On the other hand, regarding the reduction of In segregation and crystal defects, the removal thereof is attempted by adding hydrogen during the growth of the barrier layer. This is because the reverse reactions are readily caused by hydrogen in the growth of InN (see Non-Patent Documents 1 and 2). Also, the addition concentration of hydrogen and timing of the addition are optimized according to the following studies because the effect of etching is significantly reduced since it is during the growth of the barrier layer.

FIGS. 2A to 2D show results of the studies of the timing of hydrogen addition, in which X ray diffraction profiles of the multiple quantum well structure in the case where hydrogen is not added to the barrier layer (FIG. 2A), the case where hydrogen is added after the barrier layer is grown to 0.5 nm (FIG. 2B), the case where hydrogen is added after the barrier layer is grown to 1 nm (FIG. 2C), and the case where hydrogen is added after the barrier layer is grown to 2 nm (FIG. 2D) are shown. The addition concentration of hydrogen in these cases is of a growth gas atmosphere composed of nitrogen and ammonia, and the film thickness of the barrier layer grown by adding hydrogen is 4 nm. Also, the number of cycles of the well layer and the barrier layer is 3, the film thickness of the well layer is 3 nm, and the photo luminescence (PL) light emitting wavelength from the multiple quantum well structure is 520 nm.

As shown in FIGS. 2A to 2D, in the case where hydrogen is added after the barrier layer is grown to 0.5 nm, possibly because segregation regions of the well layer are etched in the plane thereof and irregularities are formed, the intervals of fringe peaks of the multiple quantum well structure are not changed so much, but the peak intensities (symbols F in the drawing) are weakened. On the other hand, the case where hydrogen is added after the barrier layer is grown to about 1 nm is almost equivalent to the case where hydrogen is not added.

However, when a laser structure is realized by the growth methods in which hydrogen is not added and hydrogen is added after the growth of 1 nm or 2 nm, In segregated during the growth of the cladding layer is diffused, and large defect regions (dark regions) are formed as shown in a fluorescent microscope image of FIG. 3. This result represents the difference in the etching rate between the well layer (In composition ratio: about 20%) and the barrier layer (In composition ratio: about 1 to several %). If they are covered with the barrier layer having a low In composition ratio, it is difficult to remove the segregation regions of In and the defects because it cannot be readily etched even when hydrogen is added. Therefore, hydrogen addition to the barrier layer has to be carried out at the point of the start of the growth or when the thickness reaches about 0.5 nm or less from the start of the growth. On the other hand, when hydrogen is added at the time of growth interruption, control is difficult because the etching of the well layer is significantly fast.

FIG. 4 and FIG. 5 show study results of the hydrogen addition concentration in the case where hydrogen is added at the same time as the growth of the barrier layer. The conditions other than the addition concentrations and the multiple quantum well structure are the same as those of the case of FIG. 3. When the hydrogen addition concentration is 5% and 1.2%, fringe peaks (symbols F in the drawing) of the multiple quantum well structure are weak compared with the case of FIG. 3 in which hydrogen is not added, and therefore, it is conceivable that the surface of the well layer is partially etched. In the surface morphology of the fluorescent microscope in the case where a laser structure is manufactured, no dark region is formed when the hydrogen addition concentration is 5%, and dark regions are formed in some locations although the amount thereof is small when the hydrogen addition concentration is 1.2%. Also, when the hydrogen addition concentration is 0.5%, dark regions are formed at extremely many locations, though not as much as FIG. 3.

According to more detailed study results of hydrogen addition amount dependency, it is found out that the hydrogen addition concentration has to be at least 1% or higher in order to eliminate the defects from the vicinity of the active layer (presuppose stripe having a width of several μm) in an actual device.

On the other hand, regarding the upper limit of the hydrogen addition concentration, although the effect of etching becomes strong, the part free from defects is not readily etched and in a GaN growth mode because the source material gas is also supplied, and the part with defects (In segregation and the part having excessive In composition ratio) is in an etching mode by hydrogen. Furthermore, when the etching of the defect regions is finished, since the source material gas is supplied, naturally, only the GaN growth mode is carried out if hydrogen is added. Therefore, no particular value is set as the upper limit of the hydrogen addition concentration, but since the residual amount of hydrogen also increases when the hydrogen addition amount is increased, the subsequent growth of the InGaN layer becomes difficult. Therefore, several tens of percent or less is desirable as the upper limit of the hydrogen addition amount. In order to realize the green-region laser, 10% or lower is desirable as the hydrogen addition concentration because the In composition ratio increases and the etching rate at a flat part also becomes faster.

FIG. 6 shows the relation between the grown film thickness of the barrier layer and the PL wavelength of the active layer after the addition of 5% hydrogen is stopped. Immediately after the addition of hydrogen is stopped, since hydrogen is remaining in a reactor, hydrogen is mixed into the well layer to reduce the In composition ratio, and the PL wavelength of the active layer is reduced. Therefore, in order to sufficiently purge the added hydrogen, the film thickness of the barrier layer to which no hydrogen is added is desirably 4 nm or more.

FIG. 7 shows the relation between the film thickness and the PL intensity in the case where the barrier layer is grown while adding 5% hydrogen. Along with the increase of the addition time, In segregation layers and defects are etched, and the PL intensity is improved. The addition time cannot be uniformly determined because the time depends on the addition amount of hydrogen, but it is expected that the In segregation layers and the defects can be removed by etching if the thickness is as large as about 1 nm to 5 nm because the growth rate of an InGaN barrier layer is slow in general.

FIG. 8 shows a photograph of a transmission electron microscope in the case where 5% hydrogen addition is carried out during the period when the barrier layer is grown to about 4 nm from the start of the growth based on the above-described results. For comparison, a photograph in the case where hydrogen addition is carried out after the barrier layer is grown to 2 nm is also shown. The PL wavelength is 550 nm, and since the segregation layers of In and defect regions having bad crystallinity and the regions having excessive In composition ratio are etched when hydrogen addition is carried out, inhomogeneity are formed on the well layer or a part of the well layer is etched. Alternatively, the In component is removed and replaced by a GaN layer. On the other hand, when the hydrogen addition is not carried out or when the hydrogen addition is carried out after the barrier layer is grown to 2 nm, although the reduction of the film thickness due to etching is not observed, generation of dark region (defects) due to the In segregation is observed by a fluorescent microscope.

The effects obtained by typical embodiments of the inventions disclosed in this application will be briefly described below.

According to the present invention, since In segregation and deterioration of crystallinity are suppressed, the improvement of laser characteristics in the region from blue (440 nm) to green (530 nm), the increase of the laser oscillation wavelength, the improvement of efficiency of a green light emitting diode, and the improvement of light emitting diode characteristics in the vicinity of 600 nm can be realized.

FIG. 9 and FIG. 10 show PL results, in which the period-number dependencies at a PL wavelength of 500 nm in the case where hydrogen addition is not carried out and the case where the present invention is used are shown. When the present invention is used, since defects in each well layer are removed, the PL intensity is not lowered even when the number of periods is increased. However, in the conventional technique, since defects are accumulated in each layer, the upper limit of the number of periods is about 3. Similar results are observed also in the PL wavelength dependency. That is, the PL intensity is rapidly lowered from the vicinity of 450 nm in the conventional technique, but large reduction of the PL intensity is not observed even at 530 nm or more in the present invention.

BRIEF DESCRIPTIONS OF THE DRAWINGS

FIG. 4 is graphs showing the relation between the hydrogen addition concentration and the X ray diffraction profile of an InGaN multiple quantum well structure;

FIG. 5 is fluorescent microscope photographs showing the relation between the hydrogen addition concentration and the surface morphology of the InGaN quantum well structure;

FIG. 8 is photographs of a transmission electron microscope showing a cross section of the InGaN quantum well structure in the case where 5% hydrogen addition is carried out during the period when the barrier layer is grown to about 4 nm from the start of the growth;

FIG. 17 is a band structure drawing of the InGaN-based nitride semiconductor optical device according to the sixth embodiment of the present invention.

DESCRIPTIONS OF THE PREFERRED EMBODIMENTS

Figure 1:
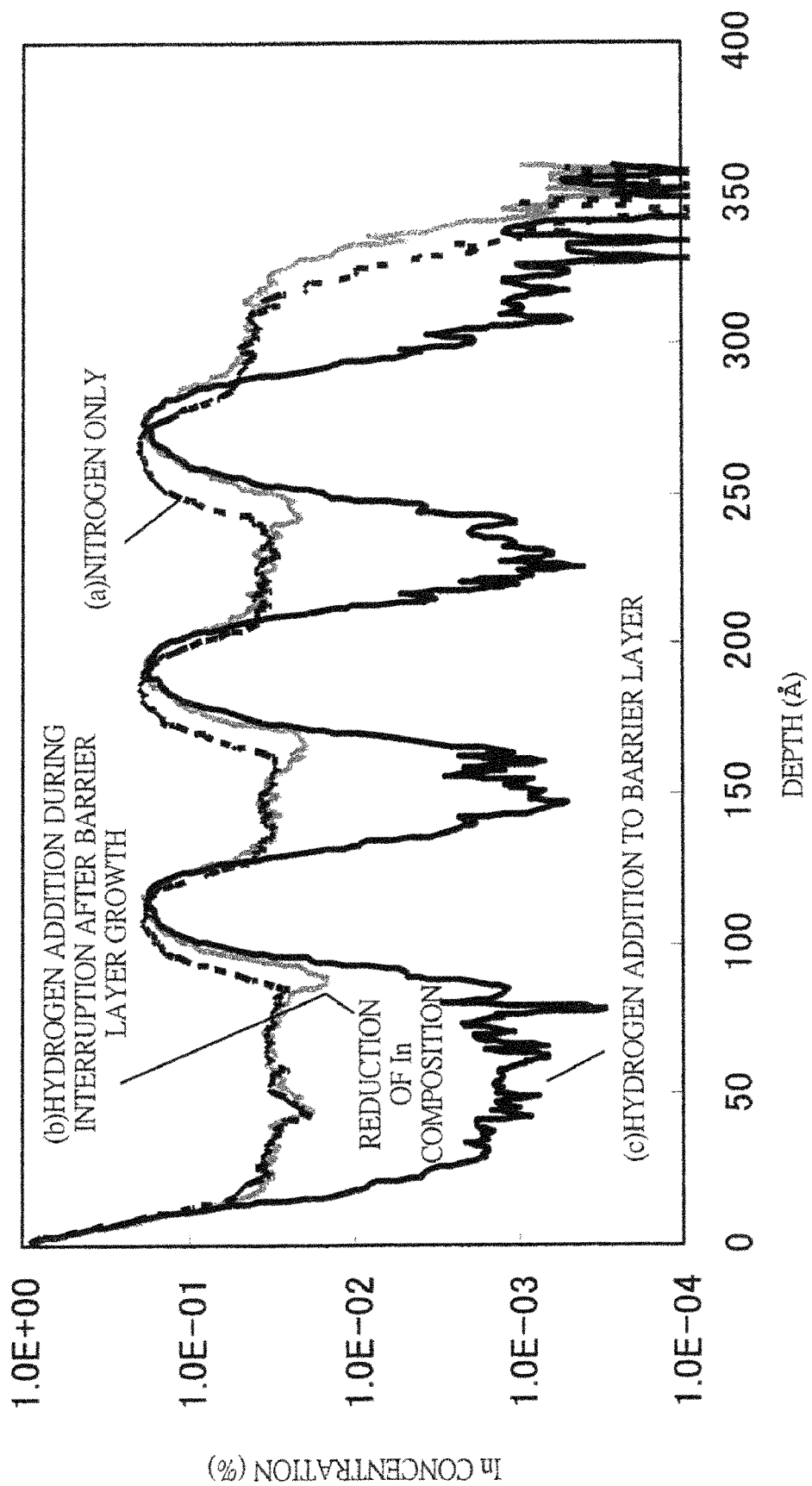
FIG. 1 is a graph showing profiles of the In composition in conventional InGaN quantum well structures.
Figure 2A:
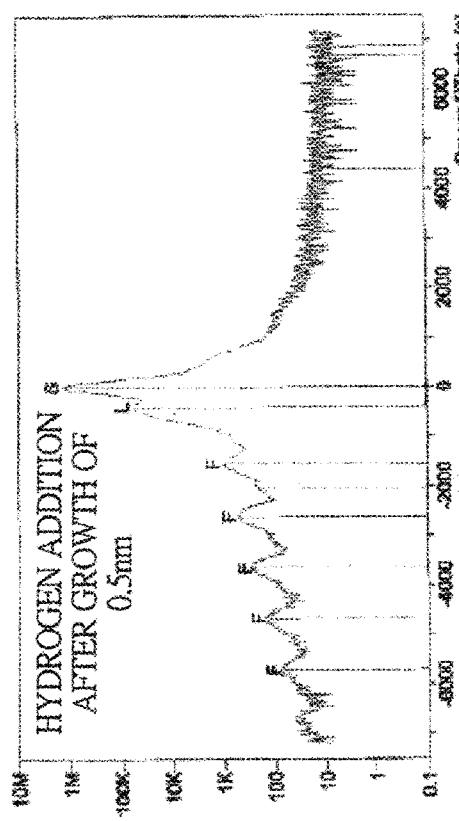
FIG. 2A is a graph showing the relation between start timing of hydrogen addition and an X ray diffraction profile of an InGaN quantum well structure.
Figure 2B:
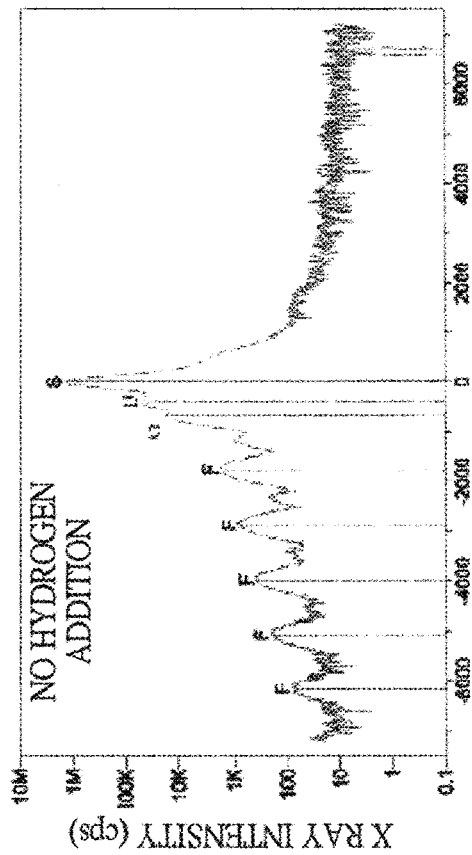
FIG. 2B is a graph showing the relation between start timing of hydrogen addition and an X ray diffraction profile of an InGaN quantum well structure.
Figure 2C:
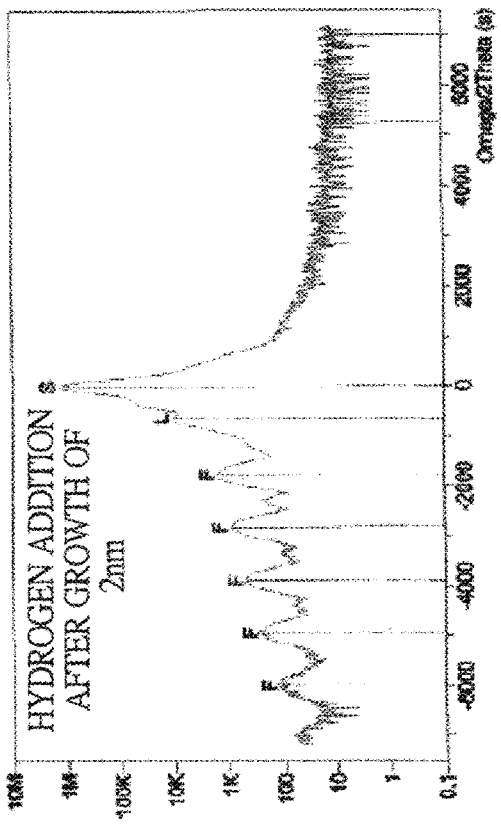
FIG. 2C is a graph showing the relation between start timing of hydrogen addition and an X ray diffraction profile of an InGaN quantum well structure.
Figure 2D:
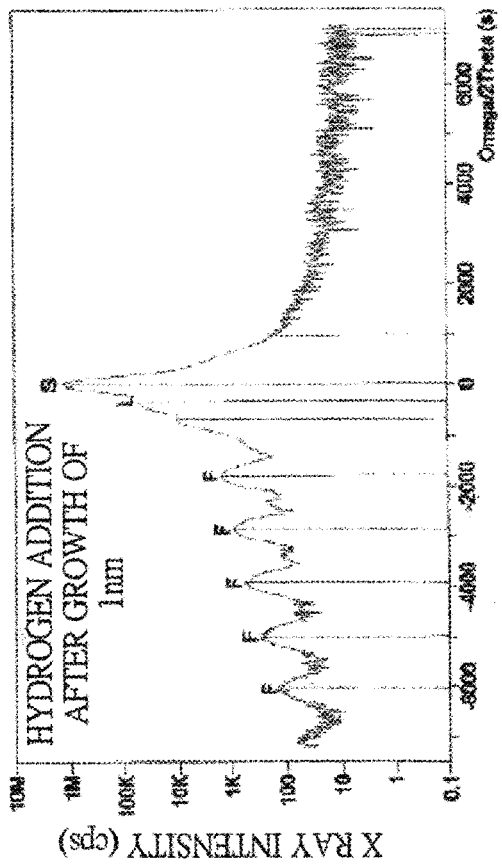
FIG. 2D is a graph showing the relation between start timing of hydrogen addition and an X ray diffraction profile of an InGaN quantum well structure.
Figure 3:
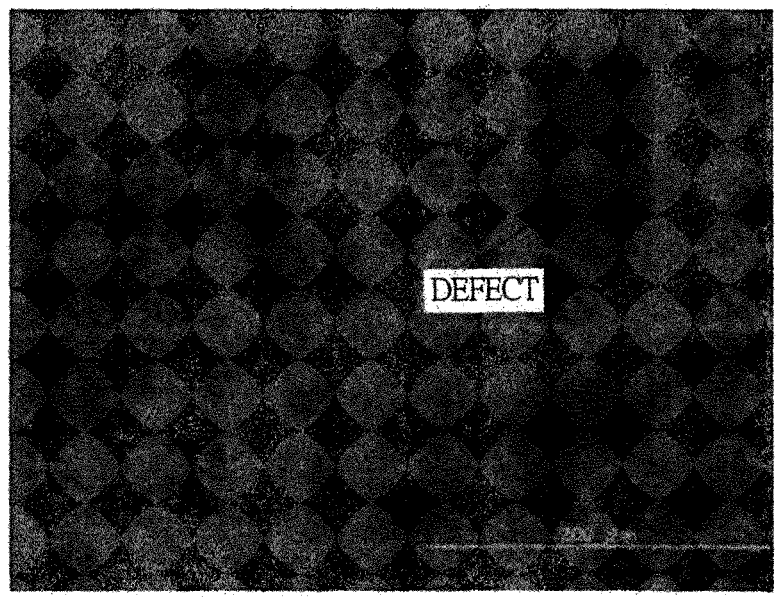
FIG. 3 is a fluorescent microscope photograph showing the surface morphology of the InGaN quantum well structure.
Figure 6:
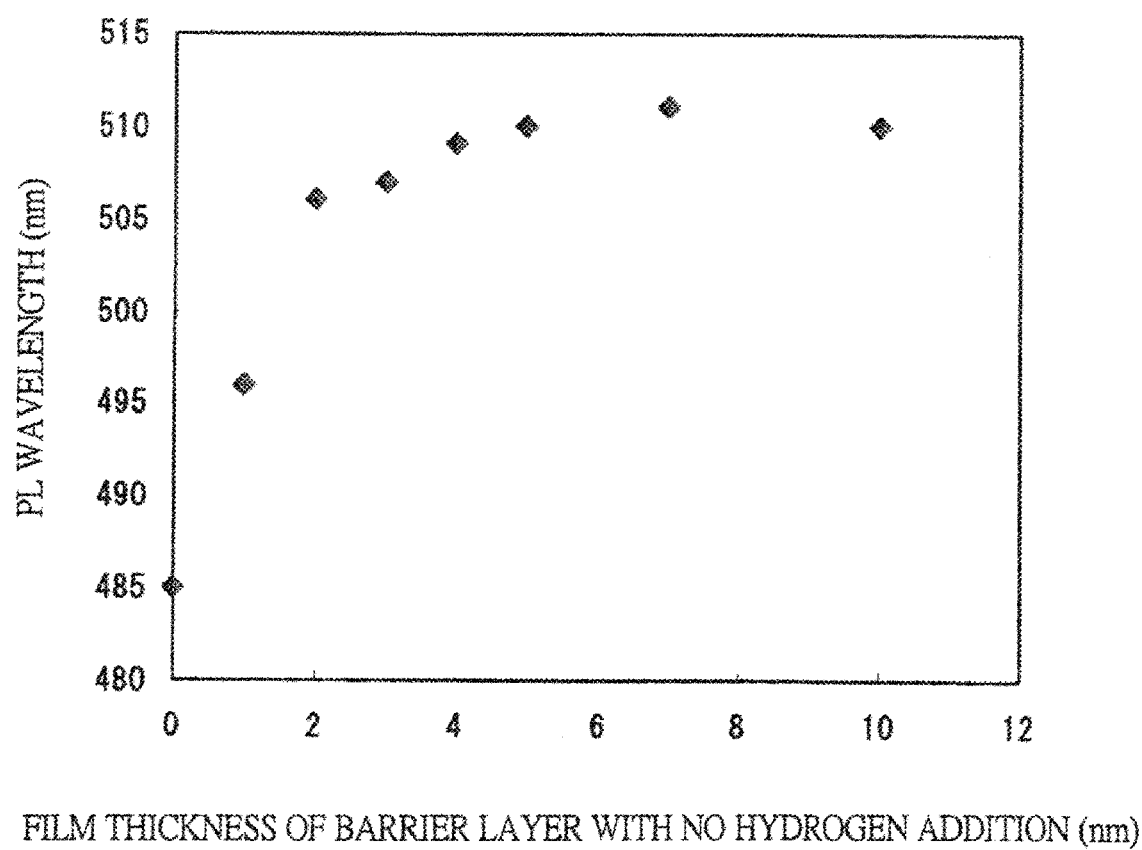
FIG. 6 is a graph showing the relation between the grown film thickness of the barrier layer and the PL wavelength of the active layer after addition of 5% hydrogen is stopped.
Figure 7:
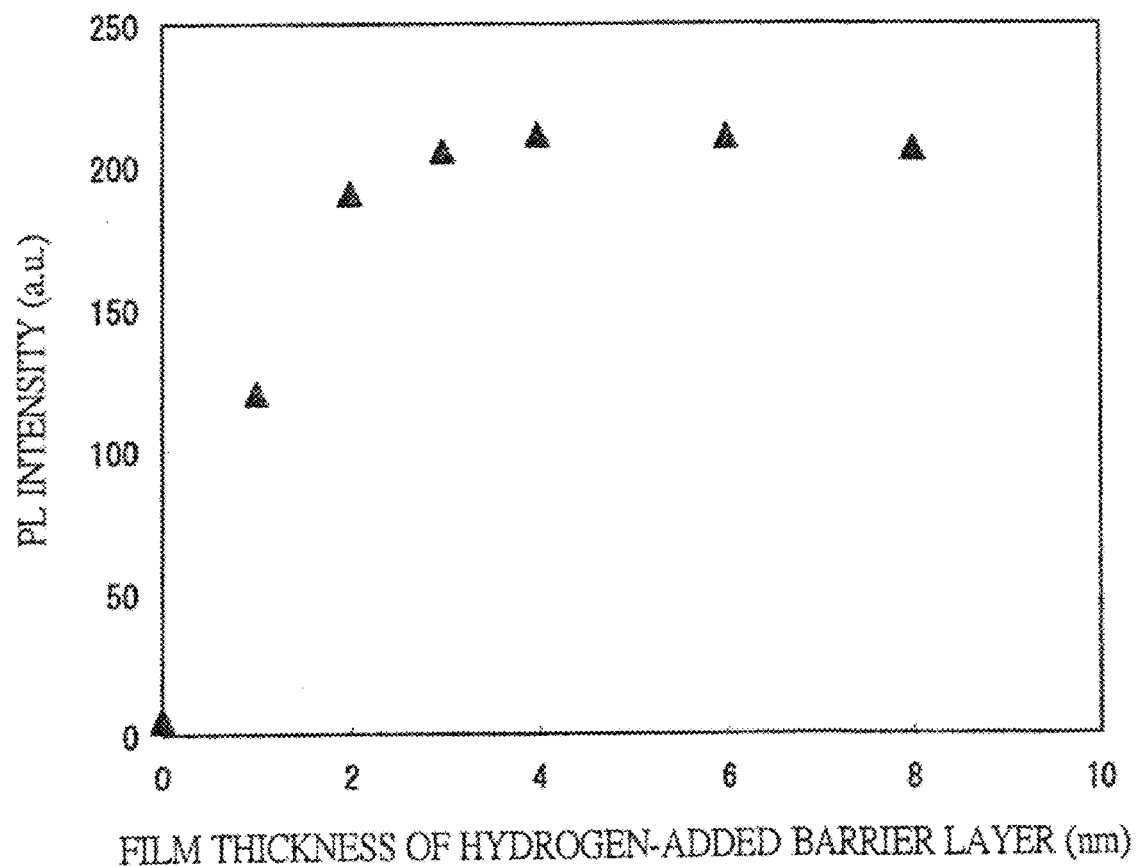
FIG. 7 is a graph showing the relation between the film thickness and the PL intensity in the case where the barrier layer is grown while adding 5% hydrogen.
Figure 9:
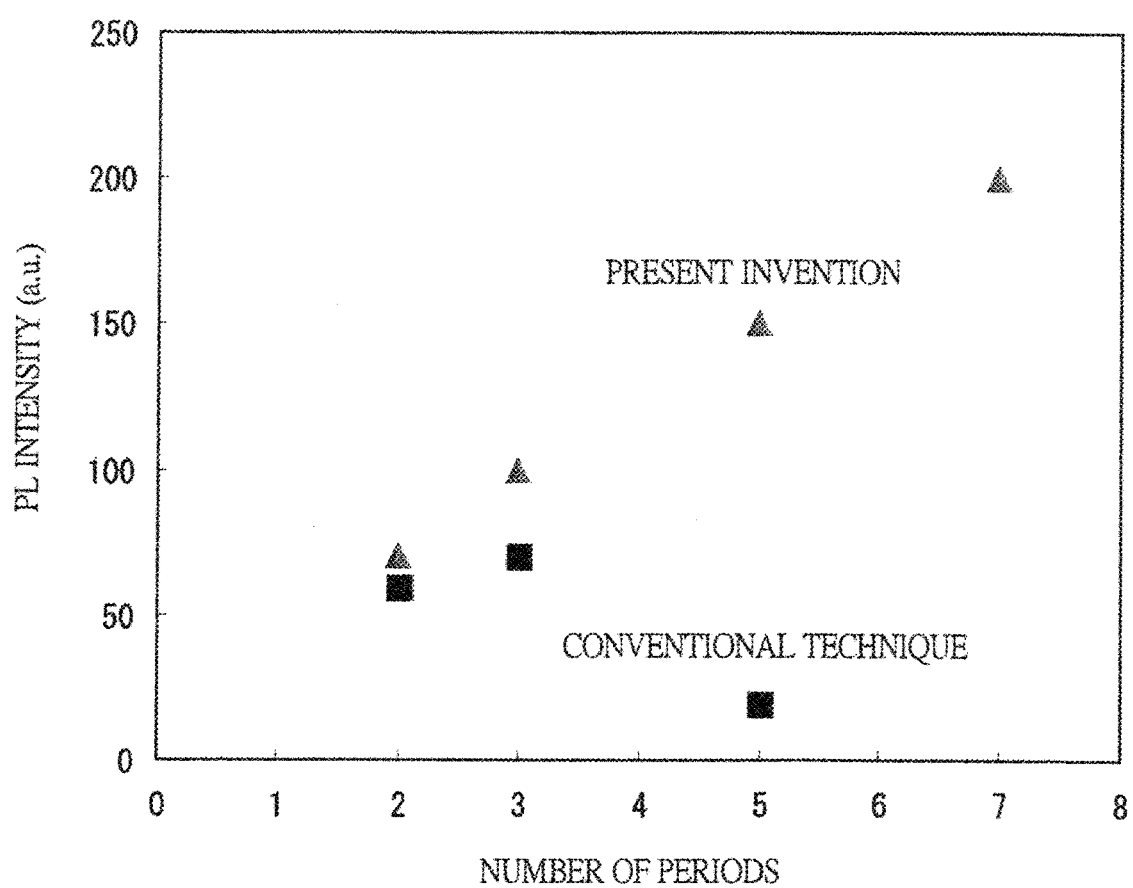
FIG. 9 is a graph showing a period-number dependency of the PL intensity in the present invention and a conventional technique.
Figure 10:
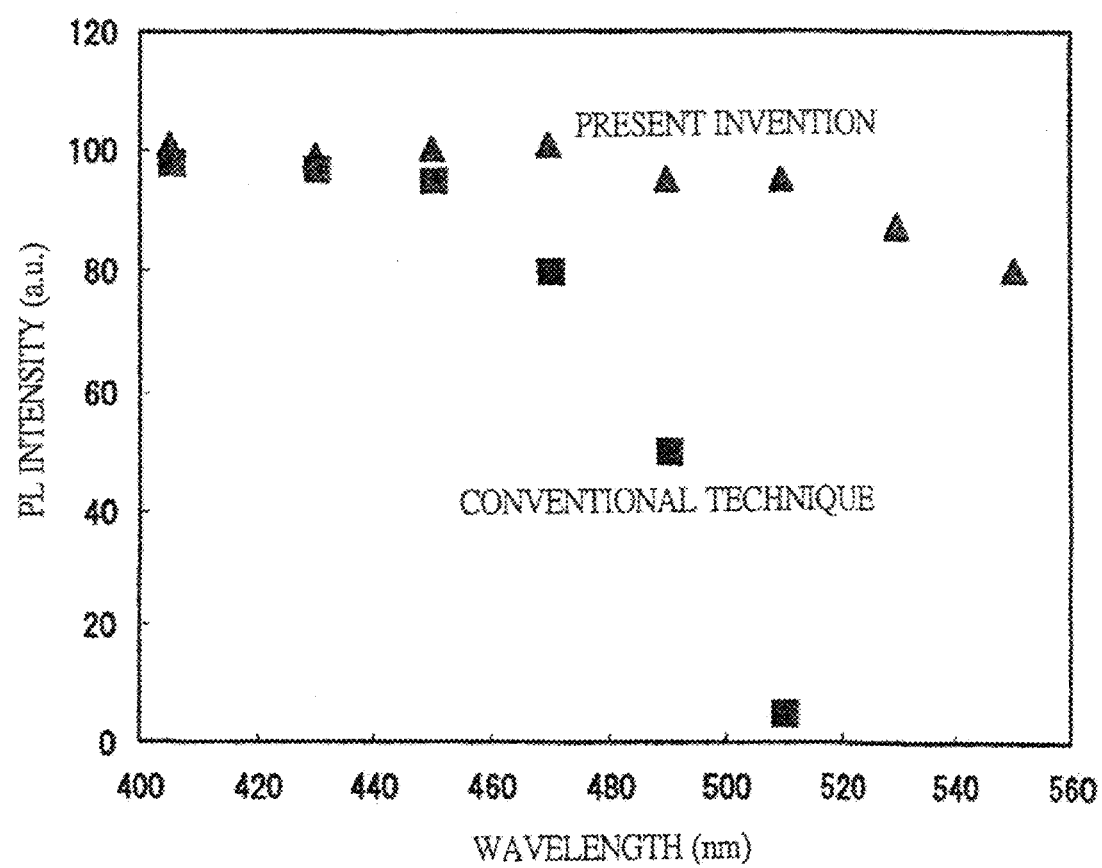
FIG. 10 is a graph showing the PL wavelength dependency of the PL intensity in the present invention and the conventional technique.

Hereinafter, embodiments of the present invention will be described in detail with reference to the accompanying drawings. Note that components having the same function are denoted by the same reference numbers throughout the drawings for describing the embodiments, and the repetitive description thereof will be omitted. Also, the description of the same or similar portions is not repeated in principle unless particularly required in the following embodiments. Further, in the drawings used for describing the following embodiments, hatching is used in some cases even in a plan view so as to make the structure easily understood.

First Embodiment

Figure 11:
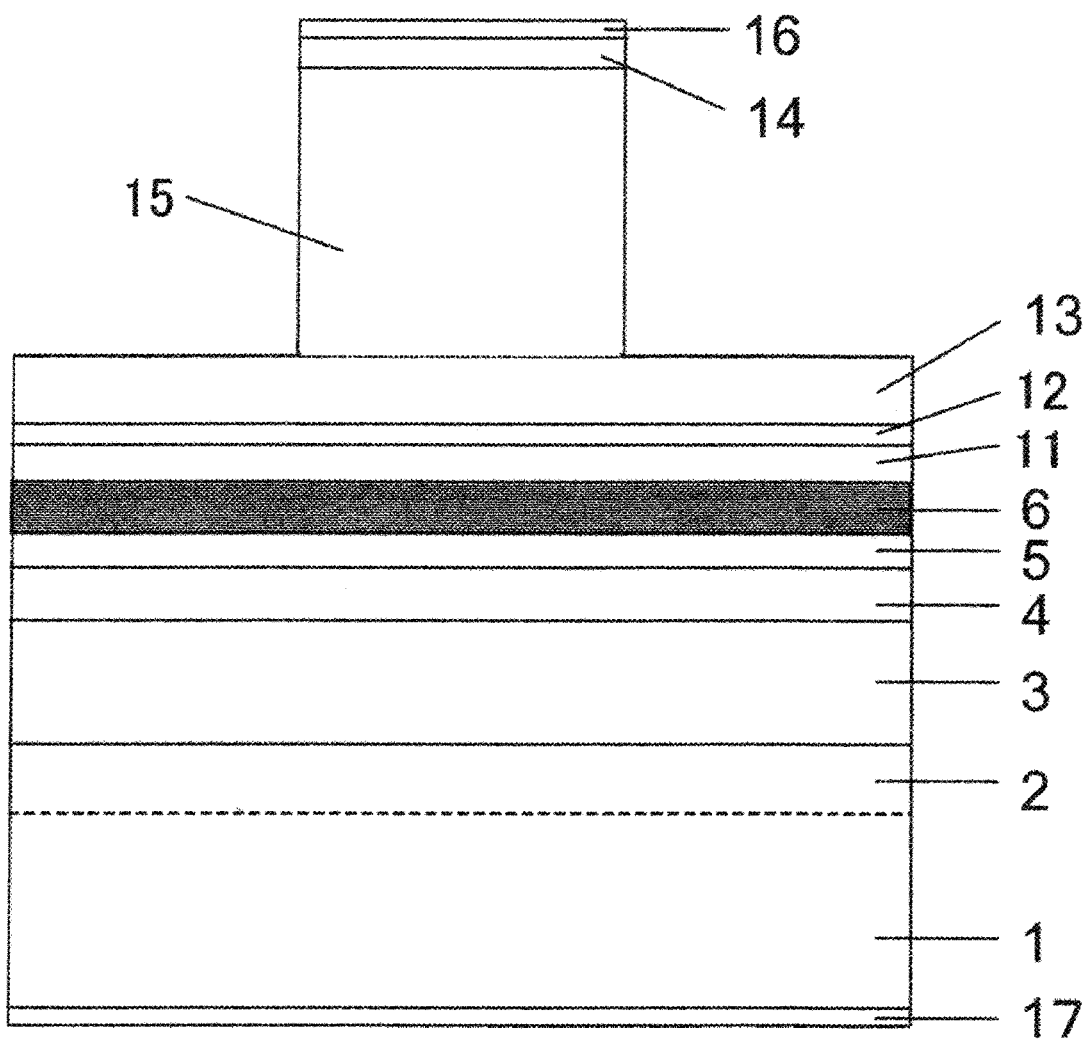
FIG. 11 is a cross-sectional view of an InGaN-based nitride semiconductor optical device according to a first embodiment of the present invention.
Figure 12:
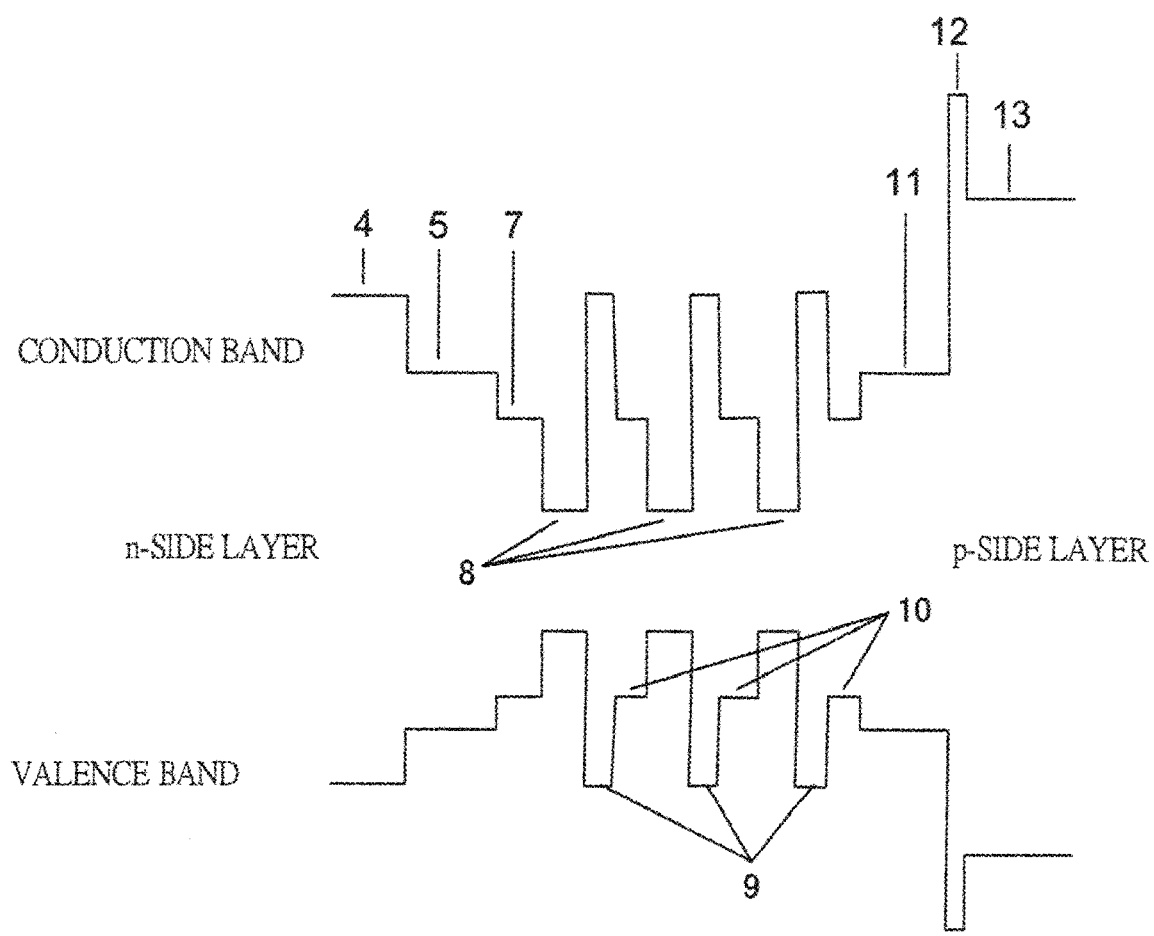
FIG. 12 is a band structure drawing of the InGaN-based nitride semiconductor optical device according to the first embodiment of the present invention.

A first embodiment of the present invention will be described with reference to a cross-sectional view (FIG. 11) and a band structure drawing (FIG. 12). By the metal-organic chemical vapor deposition, a Si-doped n-type GaN buffer layer 2 (film thickness: 1000 nm, Si concentration: $1 \times 10^{18}$ $cm^{-3}$), a Si-doped n-type AlGaN cladding layer 3 (Al composition ratio: 0.04, film thickness: 2500 nm, Si concentration: $1 \times 10^{18}$ $cm^{-3}$), a Si-doped n-type GaN guide layer 4 (film thickness: 100 nm, Si concentration: $5 \times 10^{17}$ $cm^{-3}$), an undoped InGaN guide layer 5 (In composition ratio: 0.01, film thickness: 60 nm), and an undoped InGaN multiple quantum well active layer 6 (the number of periods: 3, In composition ratio of an undoped InGaN well layer 8: 0.20, film thickness of the layer 8: 3.0 nm, In composition ratio of GaN layer 9 and an undoped InGaN barrier layer 7: 0.02, film thickness of the layers 9 and 10: 4 nm and 10 nm) are formed on a (0001) n-type GaN substrate 1. FIG. 12 shows details of the undoped InGaN multiple quantum well active layer 6 at this case by a band structure drawing.

In the present embodiment, first, the undoped InGaN guide layer 5, an undoped InGaN barrier layer 7 (In composition ratio: 0.02, film thickness: 14 nm), and the undoped InGaN well layer 8 (In composition ratio: 0.20, film thickness: 3.0 nm) are grown in a gas atmosphere composed of nitrogen and ammonia. Then, the GaN layer 9 (film thickness: 4 nm) is grown while adding hydrogen to the gas atmosphere composed of nitrogen and ammonia. Next, the InGaN barrier layer 10 (In composition ratio: 0.02, film thickness: 10 nm) is grown in the gas atmosphere to which hydrogen is not added. Since the GaN layer 9 is grown by using the gas to which hydrogen is added, In is not taken into the crystal thereof. Therefore, it does not matter if the source material gas is rapidly switched by using TMIn (trimethylindium) as a supplied source material. Further, the growth temperature of the undoped InGaN well layer 8 is 760° C., the growth temperature of the undoped barrier layer is 792° C., and the growth temperatures thereof are different, and therefore, the temperature is reduced and increased while carrying out the growth around 3 nm of both ends of the undoped barrier layer.

Next, after the undoped InGaN multiple quantum well active layer 6 is grown, an undoped InGaN guide layer 11 (In composition ratio: 0.01, film thickness: 60 nm), a Mg-doped p-type AlGaN electron stopper layer 12 (Al composition ratio: 0.14, film thickness: 10 nm, Mg concentration $1 \times 10^{19}$ $cm^{-3}$), a Mg-doped p-type AlGaN cladding layer 13 (Al composition ratio: 0.04, film thickness: 50 nm, Mg concentration: $2 \times 10^{19}$ $cm^{-3}$), and a Mg-doped p-type GaN contact layer (film thickness: 50 nm, Mg concentration: $1.5 \times 10^{20}$ $cm^{-3}$) are sequentially grown. Thereafter, after a mesa stripe 15 having a width of 2 μm is formed by dry etching using an oxide film as a mask and a p-type electrode 16 is subsequently deposited, the back surface of the (0001) n-type GaN substrate 1 is polished and an n-type electrode 17 is deposited thereon, and then, the substrate is cut along the direction perpendicular to the stripe to be divided into respective devices.

Table 2 summarizes the comparison of device characteristics of the case where hydrogen is not added to the barrier layer, the case of the conventional technique in which hydrogen is added to the entire barrier layer, and the present embodiment.

TABLE 2

|  | NO HYDROGEN ADDITION | ADDITION OF HYDROGEN TO ENTIRE BARRIER LAYER | PRESENT INVENTION |
|---|---|---|---|
| LASING WAVELENGTH (nm) | NO LASING | 438 nm | 480 nm |
| THRESHOLD CURRENT VALUE (mA) | NO LASING | 70 mA | 50 mA |
| SLOPE EFFICIENCY (mW/mA) | NO LASING | 0.8 | 1.2 |
| FFP-V (deg) | NO LASING | 10 | 14 |

In the case where hydrogen is not added to the barrier layer, many defects are caused, and laser does not oscillate. In the case where hydrogen is added to the entire barrier layer, laser oscillates, but the lasing wavelength thereof is reduced due to the contamination of hydrogen into the well layer. Furthermore, since the entire barrier layer becomes a GaN layer due to the addition of hydrogen, a sufficient refractive index difference cannot be obtained, and the confinement of light into an active layer is weakened. As a result, the spread angle of a far field pattern (FFP) in a perpendicular direction is small, and the threshold current value and efficiency are lowered.

On the other hand, in the present embodiment, since defects are reduced by adding hydrogen to a part of the barrier layer and the GaN/InGaN structure is formed, light confinement of the active layer can be ensured, and good laser characteristics can be realized even at a lasing wavelength of 480 nm. Also, when a similar light emitting layer is applied to a light emitting diode, efficiency can be improved by 40% compared with the case of adding no hydrogen at a lasing wavelength of 520 nm.

In the present embodiment, the case where the present invention is applied to a ridge-type device structure has been described. However, the present invention can be applied also to an embedded-type device structure. Further, the well layer and the barrier layer can have the film thicknesses other than those described above. Particularly, the film thickness of the barrier layer at the point of hydrogen addition, the addition concentration of hydrogen, and the film thickness thereof after hydrogen addition may be the values other than those described above as long as they are within the range in which the effects of the present invention can be obtained. Furthermore, the film thicknesses and compositions of the cladding layer and the guide layer are also not limited to the values of the present embodiment.

Second Embodiment

Figure 13:
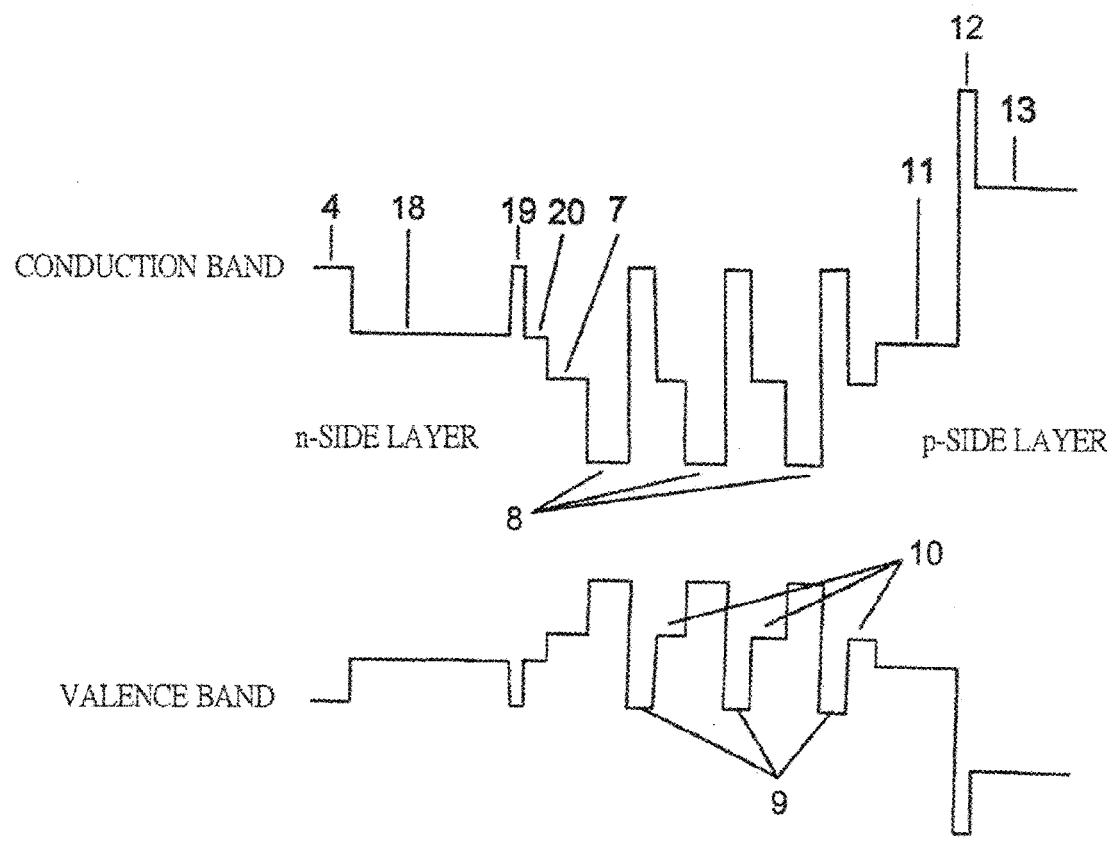
FIG. 13 is a band structure drawing of the InGaN-based nitride semiconductor optical device according to the second embodiment of the present invention.

FIG. 13 is a band structure drawing in the vicinity of the active layer in the case where the present invention is applied to the undoped InGaN guide layer 5, which is a second embodiment of the present invention.

First, the Si-doped n-type GaN buffer layer 2 (film thickness: 1000 nm, Si concentration: $1 \times 10^{18}$ cm$^{-3}$), the Si-doped n-type AlGaN cladding layer 3 (Al composition ratio: 0.04, film thickness: 2500 nm, Si concentration: $1 \times 10^{18}$ cm$^{-3}$), and the Si-doped n-type GaN guide layer 4 (film thickness: 100 nm, Si concentration: $5 \times 10^{17}$ cm$^{-3}$) are sequentially formed on the (0001) n-type GaN substrate 1 by the metal-organic chemical vapor deposition through the steps similar to those of the above-described first embodiment.

Next, after an undoped InGaN guide layer 18 (In composition ratio: 0.01, film thickness: 110 nm) is grown to an intermediate point in a gas atmosphere composed of nitrogen and ammonia, a GaN layer 19 (film thickness: 2.5 nm) is grown in a gas atmosphere to which hydrogen is added at 5%, and segregation layers of In and defects formed in the undoped InGaN guide layer 18 are removed. Next, a rest of an undoped InGaN guide layer 20 (film thickness: 10 nm) is grown in a gas atmosphere composed of nitrogen and ammonia, and then, a laser structure is manufactured through the steps similar to those of the above-described first embodiment.

According to the present embodiment, even when the film thickness of the undoped InGaN guide layer 18 is increased, the deterioration of crystallinity due to segregation of In can be suppressed by the hydrogen-added GaN layer 19. Moreover, the confinement of light to the active layer can be increased by increasing the film thickness of the undoped InGaN guide layer 18. As a result, compared with the above-described first embodiment, the device characteristics can be improved, that is, the threshold current value can be reduced from 50 mA to 40 mA, and the slope efficiency can be improved from 1.2 mW/mA to 1.35 mW/mA.

Note that, since the In composition ratio of the undoped InGaN guide layer 18 is small, segregation of In and defects are small. Therefore, even when the film thickness of the GaN layer 19 is reduced, sufficient effects can be obtained. Also, the film thicknesses, composition ratios, and growth conditions of the layers of the present embodiment are not limited to the above-described film thicknesses, composition ratios, and growth conditions as long as they are within the range in which the effects of the present invention can be obtained.

Third Embodiment

Figure 14:
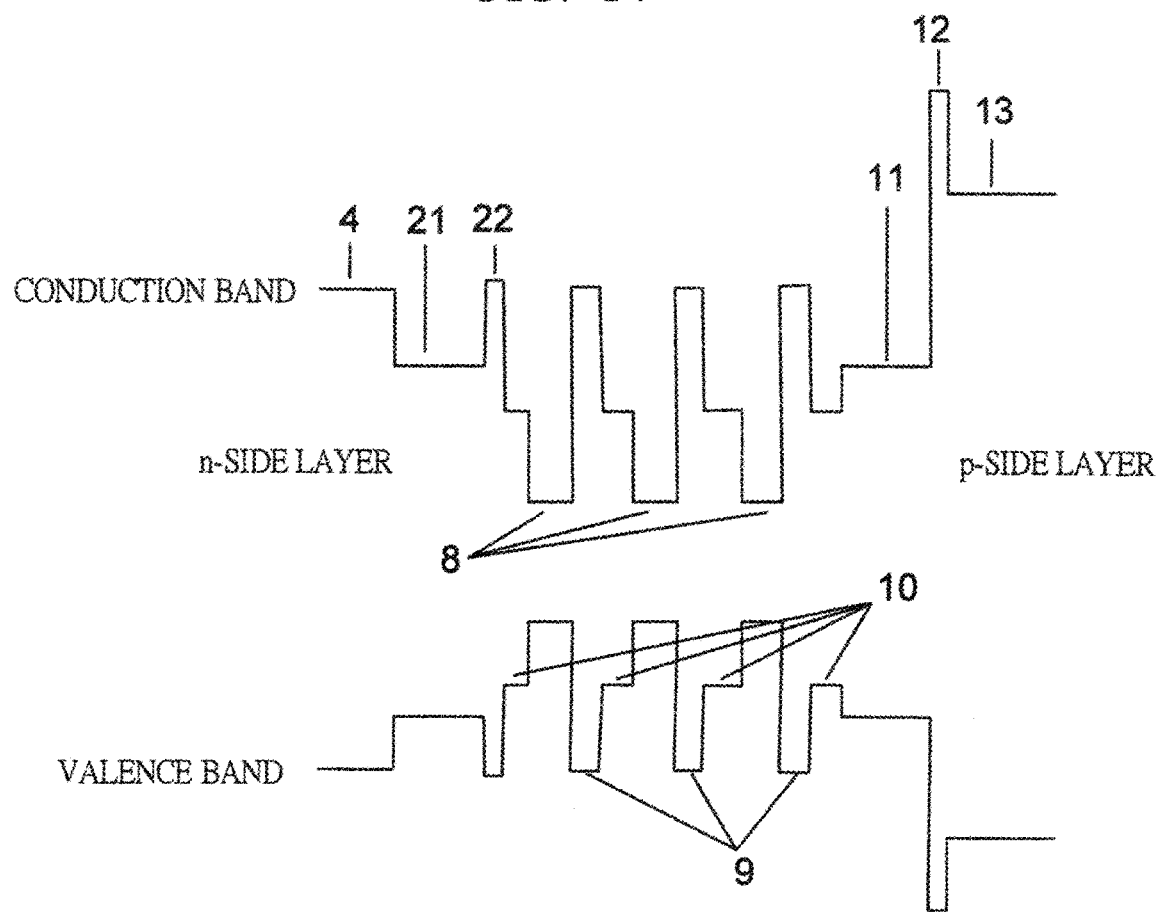
FIG. 14 is a band structure drawing of the InGaN-based nitride semiconductor optical device according to the third embodiment of the present invention.

FIG. 14 is a band structure drawing in the vicinity of the active layer in the case where the present invention is applied to the part between the undoped InGaN guide layer 5 and the undoped InGaN barrier layer 7, which is a third embodiment of the present invention.

First, the Si-doped n-type GaN buffer layer 2 (film thickness 1000 nm, Si concentration: $1 \times 10^{18}$ cm$^{-3}$) to an undoped InGaN guide layer 21 (In composition ratio: 0.01, film thickness: 120 nm) are sequentially grown on the (0001) n-type GaN substrate 1 by the metal-organic chemical vapor deposition through the steps similar to those of the above-described first embodiment.

Then, after a GaN layer (film thickness 4 nm) 22 is grown in a gas atmosphere to which hydrogen is added at 5%, the undoped InGaN barrier layer 10 (In composition ratio: 0.02, film thickness: 10 nm) is grown in a gas atmosphere to which hydrogen is not added. Thereafter, a laser structure is manufactured through the steps similar to those of the above-described first embodiment.

According to the present embodiment, the effects similar to those of the above-described second embodiment can be obtained, and even when the film thickness of the undoped InGaN guide layer 21 is increased, crystallinity deterioration caused by segregation of In can be suppressed. Moreover, the confinement of light to the active layer can be increased by increasing the film thickness of the undoped InGaN guide layer 21. As a result, the effect of improving device characteristics at the same level as the above-described second embodiment can be obtained.

Fourth Embodiment

Figure 15:
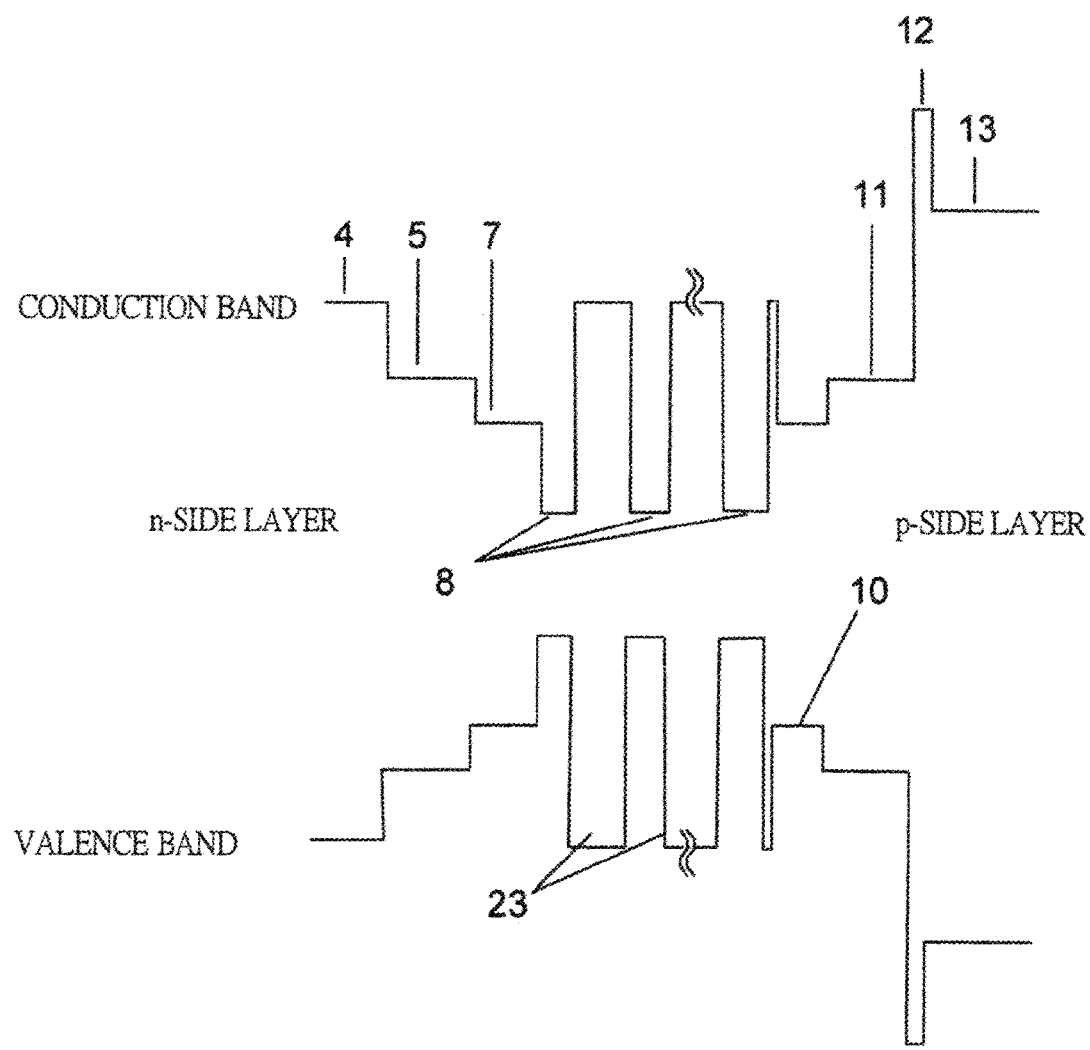
FIG. 15 is a band structure drawing of the InGaN-based nitride semiconductor optical device according to the fourth embodiment of the present invention.

FIG. 15 is a band structure drawing in the case where the barrier layer inside the active layer is changed to a GaN layer, which is a fourth embodiment of the present invention.

First, the Si-doped n-type GaN buffer layer 2 (film thickness: 1000 nm, Si concentration: $1\times10^{18}$ cm$^{-3}$) to the undoped InGaN well layer 8 (In composition ratio: 0.20, film thickness: 3.0 nm) are sequentially grown on the (0001) n-type GaN substrate 1 by the metal-organic chemical vapor deposition through the steps similar to those of the above-described first embodiment.

Then, a GaN layer 23 is grown as an inner barrier layer in a gas atmosphere to which hydrogen is added at 5%, and after the hydrogen-added barrier layer, the InGaN barrier layer 10 is grown as an upper barrier layer in a gas atmosphere to which hydrogen is not added. Thereafter, a laser structure is manufactured through the steps similar to those of the above-described first embodiment.

According to the present embodiment, the effects similar to the above-described first embodiment can be obtained with respect to In segregation and defects. However, there is a disadvantage that the refractive index difference of the active layer with respect to the cladding layer is reduced because the InGaN barrier layer 10 inside the active layer is changed to the GaN layers 23. Meanwhile, the undoped InGaN well layer 8 has compression strain, but the GaN layer 23 has no strain, and therefore, the mean strain amount of the whole active layer can be reduced, and it is effective for a high-strain InGaN well layer (increase of In composition ratio) and increase of the number of periods. Therefore, this is effective in, for example, the laser oscillation of 490 nm or more controlled by the critical film thickness by the strain, and the threshold current value at 490 nm can be reduced from 120 mA to 80 mA. Moreover, the number of periods can be increased near 405 nm, and if the number of the cycles is increased from 3 to 8, the relaxation oscillation frequency of laser can improved by about 30%.

Also in the present embodiment, crystallinity deterioration due to segregation of In can be suppressed even when the film thickness of the undoped InGaN well layer 8 is increased because a part of the InGaN barrier layer 10 is changed to the GaN layer 23 to which hydrogen is added. Moreover, the confinement of light to the active layer can be increased by increasing the film thickness of the undoped InGaN well layer 8. As a result, the effect of improving device characteristics at the same level as the above-described second embodiment can be obtained.

Fifth Embodiment

Figure 16:
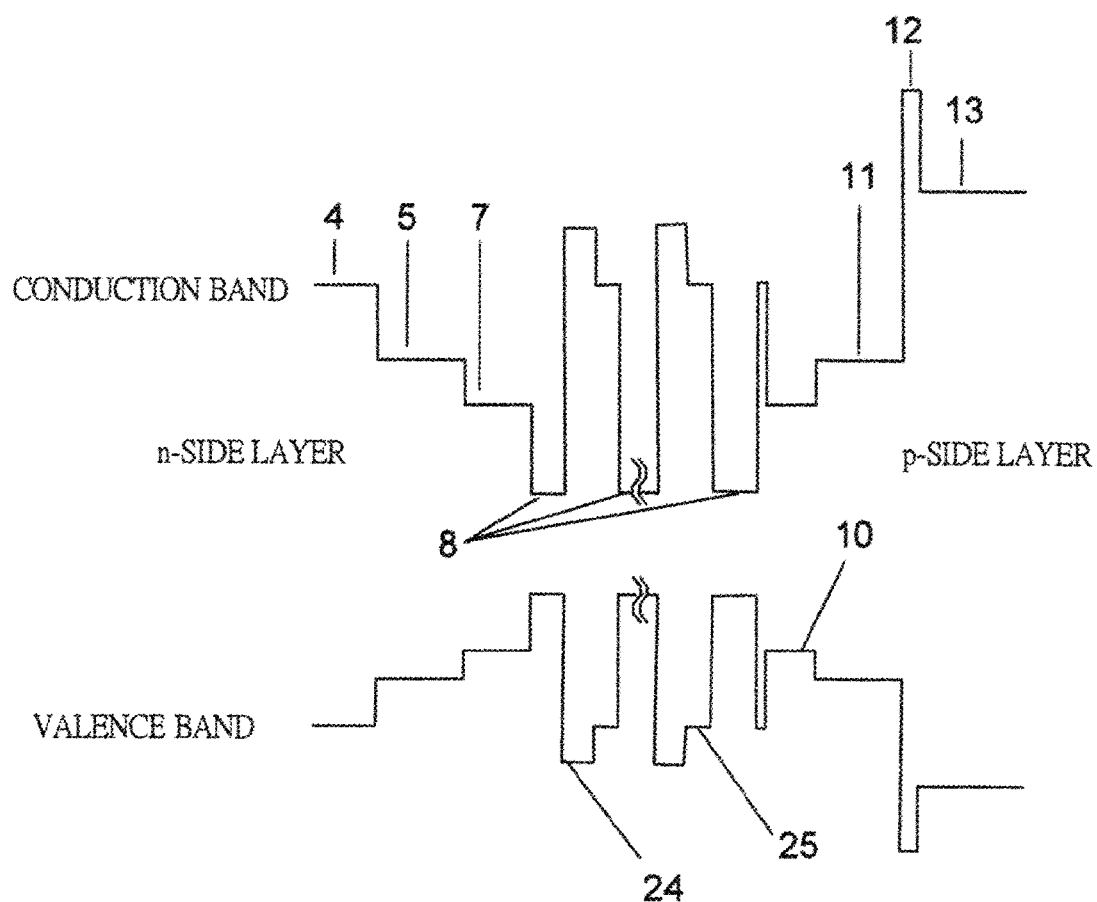
FIG. 16 is a band structure drawing of the InGaN-based nitride semiconductor optical device according to the fifth embodiment of the present invention.

FIG. 16 is a band structure drawing in the case where the barrier layer of a center part is changed to an AlGaN/GaN structure in the above-described fourth embodiment, which is a fifth embodiment of the present invention.

First, the Si-doped n-type GaN buffer layer 2 (film thickness: 1000 nm, Si concentration: $1\times10^{18}$ cm$^{-3}$) to the undoped InGaN well layer 8 (In composition ratio: 0.20, film thickness: 3.0 nm) are sequentially grown on the (0001) n-type GaN substrate 1 by the metal-organic chemical vapor deposition through the steps similar to those of the above-described fourth embodiment.

Then, after an AlGaN barrier layer 24 (film thickness: 4 nm) is grown in a gas atmosphere to which hydrogen is added at 5%, a GaN barrier layer 25 (film thickness: 6 nm) is grown in a gas atmosphere to which hydrogen is not added. Thereafter, a laser structure is manufactured through the steps similar to those of the above-described first embodiment.

According to the present embodiment, compared with the above-described fourth embodiment, the AlGaN barrier layer 24 has a tensile strain opposite to that of the InGaN barrier layer, and therefore, the present embodiment is more effective in the case where a high-strain InGaN well layer is used, the case where a well layer having large film thickness is used, and the case where the number of periods is increased.

Note that, since the composition of the AlGaN barrier layer 24 is not changed even when hydrogen is added, the layer to which hydrogen is added is the AlGaN barrier layer 24 and the layer to which hydrogen is not added is the GaN barrier layer 25 in the present embodiment. However, InGaN may be used for the layer to which hydrogen is not added. The layers can be made of opposite material systems, that is, the layer to which hydrogen is added can be a GaN layer, and the layer to which hydrogen is not added can be an AlGaN layer, and also, both the layers can be AlGaN layers. Therefore, in the present embodiment, the mean strain amount of the whole active layer can be further reduced, and it is effective for a high-strain InGaN well layer (increase of In composition ratio) and increase of the number of cycles. Therefore, this is effective in, for example, lasing wavelength of 490 nm or more controlled by the critical film thickness by the strain, and the threshold current value at 490 nm can be reduced to 70 mA.

Sixth Embodiment

FIG. 17 is a band structure drawing in the case where the effect of the In segregation layer reduction obtained by hydrogen addition is applied to the undoped InGaN well layer 8, which is a sixth embodiment of the present invention.

First, the Si-doped n-type GaN buffer layer 2 (film thickness: 1000 nm, Si concentration: $1\times10^{18}$ cm$^{-3}$) to the undoped InGaN barrier layer 7 (In composition ratio: 0.02, film thickness: 14 nm) are sequentially grown on the (0001) n-type GaN substrate 1 by the metal-organic chemical vapor deposition through the steps similar to those of the above-described first embodiment.

Then, during the growth of an undoped InGaN well layer 26 (In composition ratio: 0.30, film thickness: 3.0 nm), pulse-like hydrogen (5%, 0.5 sec) is added to form a GaN layer 27, and the crystallinity of the undoped InGaN well layer 26 having a high In composition ratio is improved.

Then, similarly to the above-described first embodiment, after the GaN layer 9 (film thickness: 4 nm) is grown in a gas atmosphere to which hydrogen is added at 5%, the InGaN barrier layer 10 (In composition ratio: 0.02, film thickness: 10 nm) is grown in a gas atmosphere to which hydrogen is not added. Thereafter, a laser structure is manufactured through the steps similar to those of the above-described first embodiment.

According to the present embodiment, in the case of the well layer having a high In composition ratio (In: 0.3 or more), etching of the In segregation and defects is not sufficient only by the barrier layer to which hydrogen is added, and therefore, the method that slightly reduces In segregation and defects also during the growth of the well layer is effective. Regarding the In composition ratio at this time, since the In composition ratio is slightly reduced only during the time when the pulse-like hydrogen is added so as to be close to a GaN layer and the In composition ratio of the entire well layer is reduced if the hydrogen addition time is long, 5% pulse-like hydrogen is added for 0.5 sec. in the present embodiment. Regarding the addition of the pulse-like hydrogen, the addition may be carried out under the conditions different from those described above as long as they are within the range in which the effects of the present invention can be obtained.

Also, since the present embodiment is applied to a well layer unlike the above-described second to fifth embodiments, the barrier layer and the guide layer can be combined with those of the above-described second to fifth embodiments. More specifically, the combination of the present embodiment and the above-described fifth embodiment is further effective for the InGaN well layer having a high In composition ratio (long wavelength) and the increase of the well layer film thickness. For example, the threshold current value of laser at 490 nm can be further reduced to 50 mA.

Although the metal-organic chemical vapor deposition is used as a growth method of crystal layers in the first to sixth embodiments, studies of hydride vapor deposition, chloride vapor deposition, and molecular beam epitaxy have also been progressing as recent growth methods of nitride semiconductors. However, from the overall viewpoints including the effects of etching by hydrogen, growth of an InGaN layer, thin film controllability and the like, the metal-organic chemical vapor deposition is advantageous, and the metal-organic chemical vapor deposition is desirable as the crystal growth method of the present invention.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to InGaN-based nitride semiconductor optical devices.

What is claimed is:

1. A manufacturing method of a nitride semiconductor optical device comprising steps of sequentially growing a first conductivity type cladding layer, a guide layer, an InGaN-based quantum well active layer, a second conductivity type cladding layer, and a second conductivity type contact layer on a semiconductor substrate, wherein
   the step of growing the InGaN-based quantum well active layer includes a step of growing an InGaN well layer and a step of growing an InGaN barrier layer,
   the step of growing the InGaN barrier layer further includes: a first step of growing a first film in a gas atmosphere containing nitrogen, ammonia and added hydrogen; and a second step of growing a second film in a gas atmosphere containing nitrogen and ammonia, where a concentration of hydrogen in the second step is lower than a concentration of hydrogen in the first step.

2. The manufacturing method of the nitride semiconductor optical device according to claim 1, wherein
   a concentration of the hydrogen in the first step is from 1 to 10% of the gas atmosphere.

3. The manufacturing method of the nitride semiconductor optical device according to claim 1, wherein
   a thickness of the film grown in the first step is 1 nm to 5 nm.

4. The manufacturing method of the nitride semiconductor optical device according to claim 1, wherein
   a thickness of the film grown in the second step is 4 nm or more.

5. The manufacturing method of the nitride semiconductor optical device according to claim 1, wherein
   the InGaN-based quantum well active layer is grown by metal-organic chemical vapor deposition.

6. The manufacturing method of the nitride semiconductor optical device according to claim 1, wherein
   the step of growing the InGaN well layer further includes: a third step of adding pulse-like hydrogen to a gas atmosphere composed of nitrogen and ammonia and growing a third film in the gas atmosphere; and a fourth step of growing a fourth film in a gas atmosphere composed of nitrogen and ammonia.

7. The manufacturing method of the nitride semiconductor optical device according to claim 1, wherein
   the InGaN barrier layer is formed on the InGaN well layer through the second step after the first step.

8. A manufacturing method of a nitride semiconductor optical device comprising steps of sequentially growing a first conductivity type cladding layer, an InGaN guide layer, an InGaN-based quantum well active layer, a second conductivity type cladding layer, and a second conductivity type contact layer on a semiconductor substrate, wherein
   the step of growing the InGaN guide layer includes: a first step of growing a film in a gas atmosphere composed of nitrogen and ammonia; a second step of adding hydrogen to a gas atmosphere composed of nitrogen and ammonia and growing a film in the gas atmosphere after the first step; and a third step of growing a film in a gas atmosphere composed of nitrogen and ammonia after the second step.

9. The manufacturing method of the nitride semiconductor optical device according to claim 8, wherein
   an addition concentration of the hydrogen in the second step is 1% or higher of the gas atmosphere.

* * * * *